(12) United States Patent
Chung

(10) Patent No.: US 7,199,625 B1
(45) Date of Patent: Apr. 3, 2007

(54) DELAY LOCKED LOOP STRUCTURE PROVIDING FIRST AND SECOND LOCKED CLOCK SIGNALS

(75) Inventor: Jiyoon Chung, South Burlington, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/230,896

(22) Filed: Sep. 20, 2005

(51) Int. Cl.
*H03L 7/06* (2006.01)

(52) U.S. Cl. .................................. 327/149; 327/158

(58) Field of Classification Search ........ 327/149–155, 327/158–163; 331/1 A, 17, 25, DIG. 2; 375/371, 373–376
See application file for complete search history.

(56) References Cited

U.S. PATENT DOCUMENTS

| | | | |
|---|---|---|---|
| 6,011,732 A | 1/2000 | Harrison et al. | |
| 6,100,735 A | 8/2000 | Lu | 327/158 |
| 6,340,904 B1 | 1/2002 | Manning | 327/156 |
| 6,490,224 B2 | 12/2002 | Manning | 365/233 |
| 6,809,600 B2 | 10/2004 | Chang et al. | 331/17 |
| 7,099,424 B1 * | 8/2006 | Chang et al. | 375/370 |

* cited by examiner

*Primary Examiner*—Linh My Nguyen
(74) *Attorney, Agent, or Firm*—Dicke, Billig & Czaja, PLLC

(57) ABSTRACT

A delay locked loop including a first circuit and a second circuit. The first circuit is configured to receive a clock signal having a frequency and to lock onto the clock signal and provide a first locked clock signal over a first frequency range and a second locked clock signal over a second frequency range. The second circuit is configured to signal the first circuit to lock onto the clock signal to provide the second locked clock signal as the frequency changes from the first frequency range to the second frequency range. Also, the second circuit is configured to signal the first circuit to provide a locked one of the first locked clock signal and the second locked clock signal in a locked output clock signal.

38 Claims, 3 Drawing Sheets

DELAY LOCKED LOOP STRUCTURE PROVIDING FIRST AND SECOND LOCKED CLOCK SIGNALS

BACKGROUND

Typically, a computer system includes a number of integrated circuit chips that communicate with one another to perform system applications. As chip speeds increase, the amount of data communicated between chips increases to meet the demands of some system applications. Other system applications do not need the increased chip speeds and bandwidth or the systems have limited power resources. In these systems, the chips can operate at slower speeds and lower power levels. In other systems, applications are being developed to take advantage of a dynamic frequency change environment. In the dynamic frequency change environment, the operational frequency of at least some of the chips can be changed from one frequency to any other frequency within a specified frequency range.

Often, the computer system includes a controller, such as a micro-processor, and one or more memory chips, such as random access memory (RAM) chips. The RAM chips can be any suitable type of RAM, such as dynamic RAM (DRAM), double data rate synchronous DRAM (DDR-SDRAM), graphics DDR-SDRAM (GDDR-SDRAM), reduced latency DRAM (RLDRAM), pseudo static RAM (PSRAM), and low power DDR-SDRAM (LPDDR-SDRAM).

Sometimes, data and a strobe signal are communicated between chips, such as a controller and a RAM, via a communications link to read and write data. The RAM receives an external clock signal and provides an internal clock signal based on the received external clock signal. To write data from the controller to the RAM, data and a strobe signal are transmitted to the RAM and the received data is sampled via the received strobe signal. The RAM clocks the received data into the chip via the internal clock signal. To read data from the RAM, output data and strobe signals are transmitted from the RAM. The output data and strobe signals are aligned with the external clock signal via the internal clock signal. The internal clock signal can be locked to the external clock signal and track the external clock signal frequency via a delay locked loop (DLL).

In a dynamic frequency change environment, the controller may slowly change the frequency of the external clock signal from one frequency to any other frequency within the frequency range of the dynamic frequency change environment. The frequency of the external clock signal gradually changes from one frequency to another frequency over many clock cycles, such as thousands of clock cycles or millions of clock cycles.

Typically, a DLL in the RAM receives the external clock signal and locks onto the external clock signal to produce the internal clock signal. The internal clock signal is used internally and to provide output data and strobe signals aligned with the external clock signal. The DLL is reset to lock onto the external clock signal within a specified number of clock cycles, such as 300 or 500 clock cycles, of the external clock signal. The DLL tracks frequency changes of the external clock signal within a limited frequency range that is less than the frequency range of the dynamic frequency change environment. However, the DLL must be reset to lock onto the external clock signal beyond the limited frequency range. Resetting the DLL and locking onto the external clock signal disrupts operation of the RAM and the system.

For these and other reasons there is a need for the present invention.

SUMMARY

One aspect of the present invention provides a delay locked loop including a first circuit and a second circuit. The first circuit is configured to receive a clock signal having a frequency and to lock onto the clock signal and provide a first locked clock signal over a first frequency range and a second locked clock signal over a second frequency range. The second circuit is configured to signal the first circuit to lock onto the clock signal to provide the second locked clock signal as the frequency changes from the first frequency range to the second frequency range. Also, the second circuit is configured to signal the first circuit to provide a locked one of the first locked clock signal and the second locked clock signal in a locked output clock signal.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
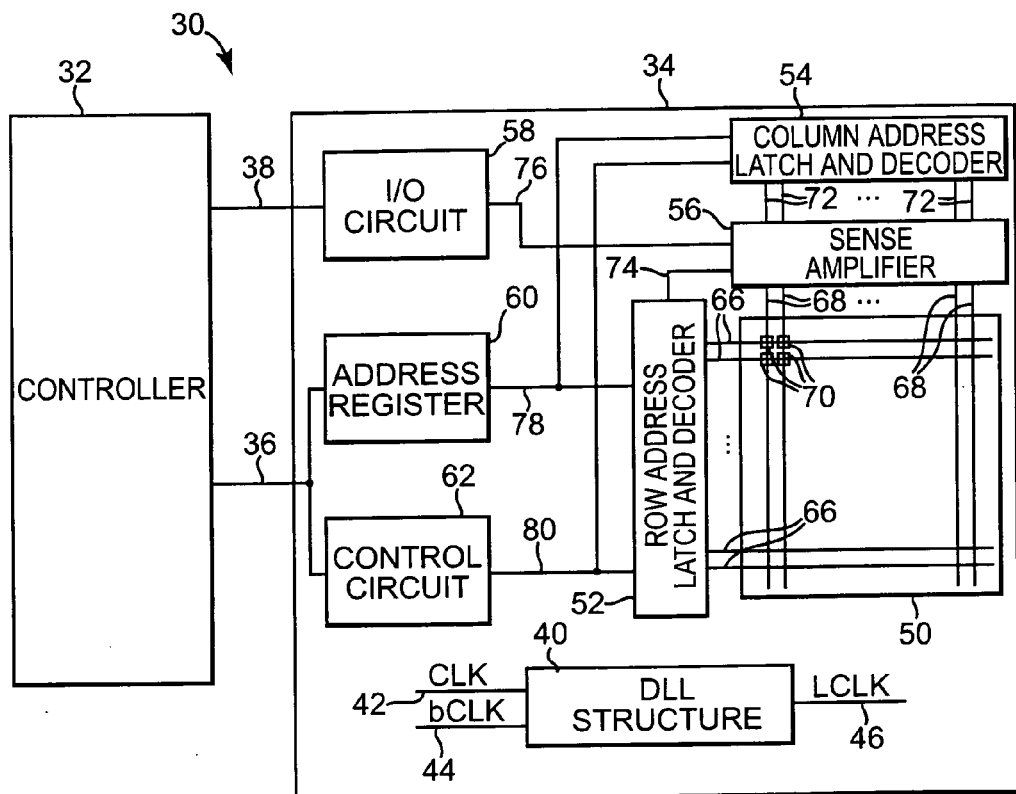
FIG. 1 is a block diagram illustrating one embodiment of a computer system according to the present invention.

FIG. 1 is a block diagram illustrating one embodiment of a computer system 30 according to the present invention. Computer system 30 includes a controller 32 and a RAM 34. Controller 32 is electrically coupled to RAM 34 via memory communications path 36 and data communications path 38. Controller 32 provides row and column addresses and control signals to RAM 34 via memory communications path 36. Controller 32 provides data and strobe signals to RAM 34 and receives data and strobe signals from RAM 34 via data communications path 38. RAM 34 can be any suitable type of RAM, such as a DRAM, DDR-SDRAM, GDDR-SDRAM, RLDRAM, PSRAM, and a LPDDR-SDRAM.

In other embodiments, controller 32 provides data to RAM 34 and receives data from RAM 34 via data communications path 38, wherein controller 32 and RAM 34 do not exchange strobe signals. Instead, the data is captured via other suitable signals, such as clock signals and CAS signals.

RAM 34 includes a DLL structure 40 that receives differential clock signals CLK at 42 and bCLK at 44 and provides a locked output clock signal LCLK at 46. Differential clock signals CLK at 42 and bCLK at 44, also referred to as clock signal CLK at 42 and inverted clock signal bCLK at 44, provide a clock signal having a clock signal frequency that changes over a system frequency range, such as the frequency range of a dynamic frequency change environment. Differential clock signals CLK at 42 and bCLK at 44 are provided via any suitable clock circuit. In one embodiment, differential clock signals CLK at 42 and bCLK at 44 are provided via an external clock circuit controlled via controller 32 to provide clock signal frequencies over the frequency range. In one embodiment, differential clock signals CLK at 42 and bCLK at 44 are provided via controller 32 to provide clock signal frequencies over the frequency range.

In other embodiments, DLL structure 40 receives a single ended clock signal, instead of differential clock signals CLK at 42 and bCLK at 44. Also, any of the clock signals herein, including locked clock signals such as locked output clock signal LCLK at 46, can be differential clock signals or single ended clock signals.

DLL structure 40 provides locked output clock signal LCLK at 46, which is continuously locked to the frequency of differential clock signals CLK at 42 and bCLK at 44 over the system frequency range. DLL structure 40 provides locked output clock signal LCLK at 46 on a forward path of RAM 34 to be used internally and to provide data and strobe signals from RAM 34 to controller 32 via data communications path 38. The data and strobe signals are output signals having edges that correspond to or are aligned with edges in differential clock signals CLK at 42 and bCLK at 44. The edges of differential clock signals CLK at 42 and bCLK at 44 are delayed an integer number of clock cycles of the differential clock signals CLK at 42 and bCLK at 44 to provide edges in the data and strobe signals. In other embodiments, DLL structure 40 can be employed in any suitable integrated circuit to provide a continuously locked output clock signal in a dynamic frequency change environment or any suitable system environment.

RAM 34 also includes an array of memory cells 50, a row address latch and decoder 52, a column address latch and decoder 54, a sense amplifier circuit 56, a RAM I/O circuit 58, an address register 60, and a control circuit 62. Conductive word lines 66, referred to as row select lines, extend in the x-direction across the array of memory cells 50. Conductive bit lines 68, referred to as digit lines, extend in the y-direction across the array of memory cells 50. A memory cell 70 is located at each cross point of a word line 66 and a bit line 68.

Each word line 66 is electrically coupled to row address latch and decoder 52 and each bit line 68 is electrically coupled to one of the sense amplifiers in sense amplifier circuit 56. The sense amplifier circuit 56 is electrically coupled to column address latch and decoder 54 via conductive column select lines 72. Also, sense amplifier circuit 56 is electrically coupled to row address latch and decoder 52 via communications path 74 and to RAM I/O circuit 58 via I/O communications path 76. Data is transferred between RAM I/O circuit 58 and controller 32 via data communications path 38.

Controller 32 is electrically coupled to address register 60 and control circuit 62 via memory communications path 36. Address register 60 is electrically coupled to row address latch and decoder 52 and column address latch and decoder 54 via row and column address lines 78. Control circuit 62 is electrically coupled to row address latch and decoder 52 and column address latch and decoder 54 via control communications path 80.

DLL structure 40 provides locked output clock signal LCLK at 46, which is used for internal timing and to provide data and strobe signals from RAM 34. DLL structure 40 receives differential clock signals CLK at 42 and bCLK at 44 and locks onto the differential clock signals CLK at 42 and bCLK at 44 to provide a first locked clock signal over a first frequency range and a second locked clock signal over a second frequency range. The first and second frequency ranges are part of the system frequency range, such as the frequency range of the dynamic frequency change environment.

DLL structure 40 locks onto differential clock signals CLK at 42 and bCLK at 44 to provide the second locked clock signal as the clock frequency changes from the first frequency range to the second frequency range and DLL structure 40 locks onto differential clock signals CLK at 42 and bCLK at 44 to provide the first locked clock signal as the clock frequency changes from the second frequency range to the first frequency range. DLL structure 40 provides a locked one of the first locked clock signal and the second locked clock signal in the locked output clock signal LCLK at 46 to continuously provide a locked clock signal in the locked output clock signal LCLK at 46 as the clock frequency traverses the system frequency range. Locked output clock signal LCLK at 46 is continuously locked to the frequency of differential clock signals CLK at 42 and bCLK at 44 over the system frequency range.

Address register 60 receives row and column addresses from controller 32 via memory communications path 36. Address register 60 supplies a row address to row address latch and decoder 52 via row and column address lines 78, and control circuit 62 supplies a RAS signal to row address latch and decoder 52 via control communications path 80 to latch the supplied row address into row address latch and decoder 52. Address register 60 supplies a column address to column address latch and decoder 54 via row and column address lines 78, and control circuit 62 supplies a CAS signal to column address latch and decoder 54 via control communications path 80 to latch the supplied column address into column address latch and decoder 54.

Controller 32 and I/O circuit 58 communicate data between controller 32 and RAM 34 via data communications path 38. I/O circuit 58 includes a suitable number of transmitter and receiver pairs and controller 32 includes a suitable number of transmitter and receiver pairs. Each transmitter and receiver pair in I/O circuit 58 corresponds to a transmitter and receiver pair in controller 32. Data communications path 38 includes one or more signal lines and each transmitter and receiver pair in I/O circuit 58 is electrically coupled to the corresponding transmitter and receiver pair in controller 32 via one of the signal lines in data communications path 38.

Sense amplifier circuit 56 includes sense amplifiers, equalization and precharge circuits, and switches. The sense amplifiers are differential input sense amplifiers and each sense amplifier receives one bit line 68 at each of the two differential inputs. One of the bit lines 68 receives a data bit from a selected memory cell 70 and the other bit line 68 is used as a reference. The equalization and precharge circuits equalize the voltage on bit lines 68 connected to the same sense amplifier prior to a read or write operation.

To read a data bit, a sense amplifier amplifies the difference between the data bit value and the reference value and provides a sensed output value to I/O circuit 58 via I/O communications path 76. I/O circuit 58 receives the sensed output value and outputs data and strobe signals based on the locked output clock signal LCLK at 46. One of the transmitter and receiver pairs in I/O circuit 58 provides the sensed output value to the corresponding transmitter and receiver pair in controller 32 via data communications path 38.

To write a data bit, one of the transmitter and receiver pairs in controller 32 provides a data bit to the corresponding transmitter and receiver pair in I/O circuit 58 via data communications path 38. I/O circuit 58 provides the data bit to a sense amplifier in sense amplifier circuit 56 via I/O communications path 76. I/O circuit 58 overdrives the sense amplifier to overdrive the data bit value onto the bit line 68 that is connected to one of the memory cells 70 and to overdrive the inverse of the data bit value onto the reference bit line 68. The sense amplifier writes the received data bit value into the selected memory cell 70.

Row address latch and decoder 52 receives row addresses and RAS signals and latches the row addresses into row address latch and decoder 52. Row address latch and decoder 52 decodes each of the row addresses to select a row of memory cells 70. Also, row address latch and decoder 52 provides sense amplifier activation signals and equalization and precharge signals to sense amplifier circuit 56 via communications path 74.

Column address latch and decoder 54 activates column select lines 72 to connect sense amplifiers in sense amplifier circuit 56 to transmitter and receiver pairs in I/O circuit 58. Column address latch and decoder 54 receives a column address and latches the column address into column address latch and decoder 54. Column address latch and decoder 54 decodes the column address to select addressed column select lines 72. In addition, column address latch and decoder 54 receives column select line activation signals from control circuit 62 via control communications path 80. The column select line activation signals indicate which of the addressed column select lines 72 are to be activated by column address latch and decoder 54. Column address latch and decoder 54 activates column select lines 72 that are addressed by the column address and selected for activation by the column select line activation signals. Activated column select lines 72 are provided to sense amplifier circuit 56 to connect sense amplifiers in sense amplifier circuit 56 to circuitry in I/O circuit 58.

Controller 32 provides addresses and control signals to control circuit 62 via memory communications path 36. Control circuit 62 receives the addresses and control signals from controller 32 and provides internal control signals to read data from or write data into the array of memory cells 50. Control circuit 62 provides RAS signals to row address latch and decoder 52 and CAS signals to column address latch and decoder 54. Also, control circuit 62 provides internal control signals to column address latch and decoder 52 to selectively activate column select lines 72. In one embodiment, RAM 34 is a PSRAM and controller 32 provides SRAM control signals to control circuit 62. The SRAM control signals do not include DRAM control signals, such as RAS and CAS signals, and control circuit 62 provides the DRAM control signals in response to the SRAM control signals.

During a read operation, control circuit 62 receives read control signals and address register 60 receives the row address of a selected memory cell or cells 70. The row address is supplied from address register 60 to row address latch and decoder 52 and latched into row address latch and decoder 52 by control circuit 62 that provides a RAS signal. Row address latch and decoder 52 decodes the row address and activates the selected word line 66. As the selected word line 66 is activated, the value stored in each memory cell 70 coupled to the selected word line 66 is passed to the respective bit line 68. The bit value stored at a memory cell 70 is detected by a sense amplifier that is electrically coupled to the respective bit line 68.

Next, control circuit 62 and address register 60 receive the column address of the selected memory cell or cells 70. The column address is supplied from address register 60 to column address latch and decoder 54 and latched into column address latch and decoder 54 by control circuit 62 that provides a CAS signal. The column address latch and decoder 54 decodes the column address to select column select lines 72. Control circuit 62 provides internal control signals to column address latch and decoder 54 to selectively activate column select lines 72 and connect selected sense amplifiers to output circuitry in I/O circuit 58. I/O circuit 58 receives sensed output values and outputs data and strobe signals based on the locked output clock signal LCLK at 46. The sensed output values are provided to transmitter and receiver pairs in I/O circuit 58 and to the corresponding transmitter and receiver pairs in controller 32 via data communications path 38.

During a write operation, data to be stored in the array of memory cells 50 is supplied from transmitter and receiver pairs in controller 32 to transmitter and receiver pairs in I/O circuit 58 via data communications path 38. Control circuit 62 receives write control signals and address register 60 receives the row address of a selected memory cell or cells 70. The row address is supplied from address register 60 to row address latch and decoder 52 and latched into row address latch and decoder 52 by control circuit 62 that provides a RAS signal. The row address latch and decoder 52 decodes the row address and activates the selected word line 66. As the selected word line 66 is activated, the value stored in each memory cell 70 coupled to the selected word line 66 is passed to the respective bit line 68 and the sense amplifier that is electrically coupled to the respective bit line 68.

Next, control circuit 62 and address register 60 receive the column address of the selected memory cell or cells 70. Address register 60 supplies the column address to column address latch and decoder 54 and the column address is latched into column address latch and decoder 54 by control circuit 62 via a CAS signal. Column address latch and decoder 54 receives column select line activation signals from control circuit 62 and activates selected column select lines 72 to connect sense amplifiers in sense amplifier circuit 56 to transmitter and receiver pairs in I/O circuit 58. I/O circuit 58 passes data from controller 32 to the sense amplifiers and overdrives the sense amplifiers to write data to the selected memory cell or cells 70 via bit lines 68.

Figure 2:
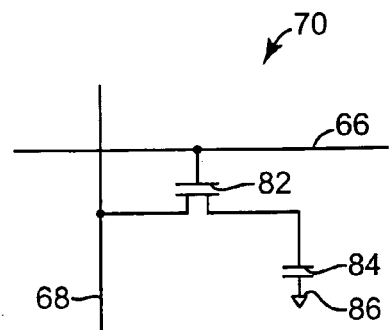
FIG. 2 is a diagram illustrating one embodiment of a random access memory cell in the array of memory cells.

FIG. 2 is a diagram illustrating one embodiment of a random access memory cell 70 in the array of memory cells 50. Memory cell 70 includes a transistor 82 and a capacitor 84. The gate of transistor 82 is electrically coupled to word line 66. One side of the drain-source path of transistor 82 is electrically coupled to bit line 68 and the other side of the drain-source path is electrically coupled to one side of capacitor 84. The other side of capacitor 84 is electrically coupled to a reference 86, such as one-half the supply voltage. Capacitor 84 is charged and discharged to represent logic 0 or logic 1.

During a read operation, a high voltage level is provided on word line 66 to turn on transistor 82. The data bit value stored on capacitor 84 is read by a sense amplifier via bit line 68. During a write operation, a high voltage level is provided on word line 66 to turn on transistor 82 and access capacitor 84. The sense amplifier connected to bit line 68 is overdriven to write a data bit value on capacitor 84 via bit line 68 and transistor 82.

A read operation on memory cell 70 is a destructive read operation. After each read operation, capacitor 84 is recharged or discharged to the data bit value that was just read. In addition, even without read operations, the charge on capacitor 84 discharges over time. To retain a stored data bit value, memory cell 70 is refreshed periodically by reading and/or writing memory cell 70. All memory cells 70 in the array of memory cells 50 are periodically refreshed to maintain their data bit values.

Figure 3:
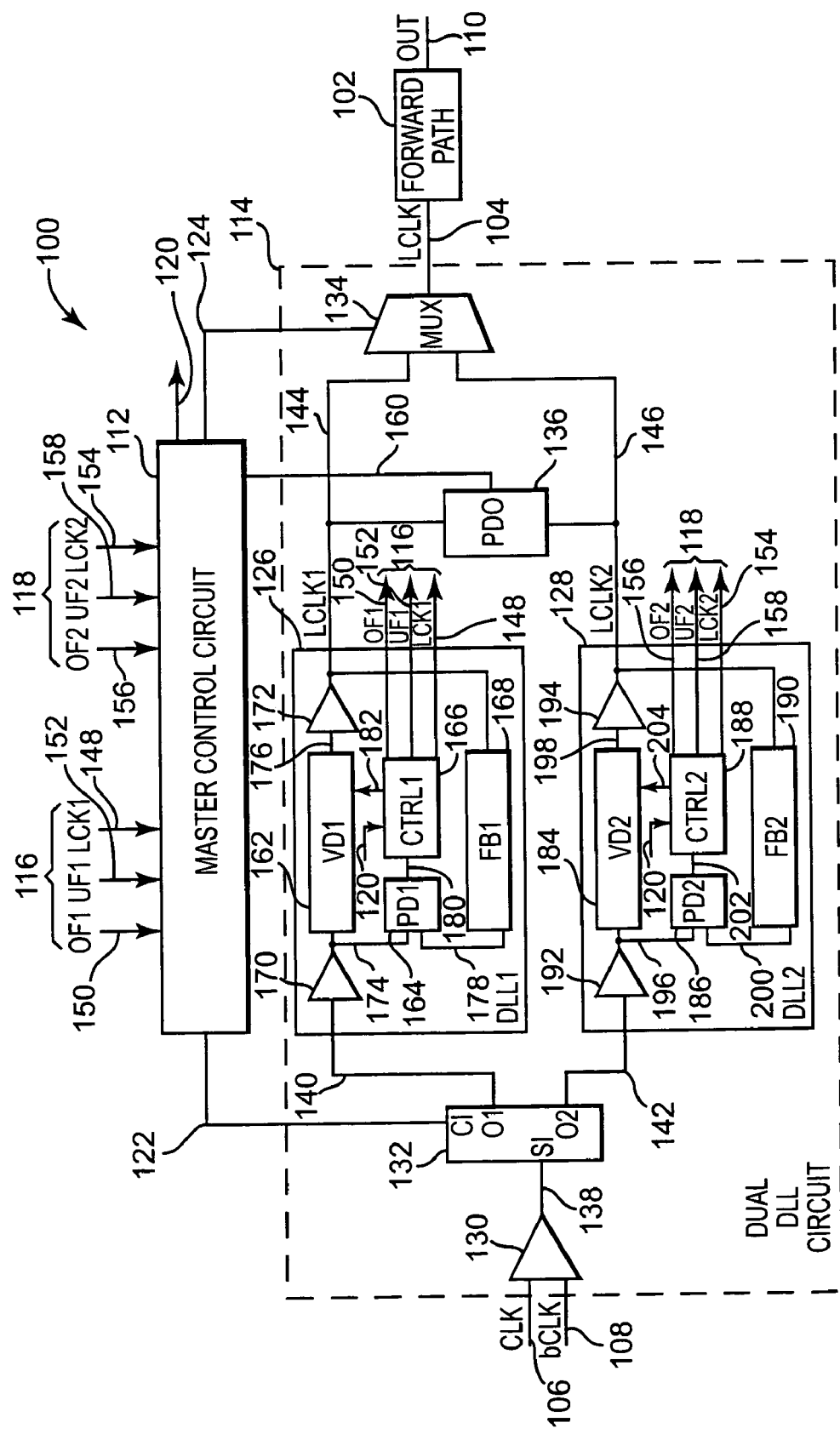
FIG. 3 is a diagram illustrating one embodiment of a DLL structure and a forward path.

FIG. 3 is a diagram illustrating one embodiment of a DLL structure 100 and a forward path 102. DLL structure 100 is electrically coupled to forward path 102 via communications path 104. DLL structure 100 is similar to DLL structure 40.

DLL structure 100 receives differential clock signals CLK at 106 and bCLK at 108 and provides locked output clock signal LCLK at 104 to forward path 102 via communications path 104. Differential clock signals CLK at 106 and bCLK at 108, also referred to as clock signal CLK at 106 and inverted clock signal bCLK at 108, provide a clock signal having a clock signal frequency that changes over a system frequency range, such as the frequency range of a dynamic frequency change environment. Differential clock signals CLK at 106 and bCLK at 108 are provided via any suitable clock circuit. In one embodiment, differential clock signals CLK at 106 and bCLK at 108 are provided via an external clock circuit controlled to provide clock signal frequencies over the system frequency range. In one embodiment, differential clock signals CLK at 106 and bCLK at 108 are provided via a controller, such as controller 32, to provide clock signal frequencies over the system frequency range.

DLL structure 100 locks onto the frequency of differential clock signals CLK at 106 and bCLK at 108 and provides a continuously locked output clock signal LCLK at 104 over the system frequency range. Forward path 102 receives locked output clock signal LCLK at 104 and provides output signals OUT at 110. Forward path 102 includes circuitry that provides output signals OUT at 110. The output signals OUT at 110 have edges that correspond to or are aligned with edges in differential clock signals CLK at 106 and bCLK at 108. The edges of differential clock signals CLK at 106 and bCLK at 108 are delayed an integer number of clock cycles of the differential clock signals CLK at 106 and bCLK at 108 to provide the edges in output signals OUT at 110. In one embodiment, forward path 102 is part of a RAM, such as RAM 34, and output signals OUT at 110 include data and strobe signals. In other embodiments, DLL structure 40 can be employed in any suitable integrated circuit to provide a continuously locked output clock signal LCLK at 104 in a dynamic frequency change environment or any suitable system environment.

DLL structure 100 includes a master control circuit 112 and a dual DLL circuit 114. Master control circuit 112 is electrically coupled to dual DLL circuit 114 via first DLL control circuit paths 116, second DLL control circuit paths 118, control signal path 120, input control path 122, and output control path 124. Dual DLL circuit 114 receives differential clock signals CLK at 106 and bCLK at 108 and provides locked output clock signal LCLK at 104 to forward path 102. Master control circuit 112 controls dual DLL circuit 114 to lock onto differential clock signals CLK at 106 and bCLK at 108 and provide a continuously locked clock signal in locked output clock signal LCLK at 104.

Dual DLL circuit 114 includes a first DLL circuit 126, a second DLL circuit 128, a receiver 130, an input circuit 132, and an output multiplexer 134. Optionally, dual DLL circuit 114 includes an output signal phase detector (PDO) 136. Receiver 130 receives differential clock signals CLK at 106 and bCLK at 108 and output multiplexer 134 provides locked output clock signal LCLK at 104.

The output of receiver 130 is electrically coupled to a signal input (SI) of input circuit 132 via clock signal path 138. A first output (O1) of input circuit 132 is electrically coupled to first DLL circuit 126 via first clock signal path 140, and a second output (O2) of input circuit 132 is electrically coupled to second DLL circuit 128 via second clock signal path 142. Master control circuit 112 is electrically coupled to a control input (CI) of input circuit 132 via input control path 122.

Receiver 130 receives differential clock signals CLK at 106 and bCLK at 108 and provides the recovered clock signal to input circuit 132 via clock signal path 138. Master control circuit 112 controls input circuit 132 via input control path 122 to provide the recovered clock signal to first DLL circuit 126 via first clock signal output path 140, or to second DLL circuit 128 via second clock signal output path 142, or to both first DLL circuit 126 and second DLL circuit 128.

First DLL circuit 126 is electrically coupled to one input of output multiplexer 134 via first locked output signal path 144 and to master control circuit 112 via first DLL control circuit paths 116. Second DLL circuit 128 is electrically coupled to another input of output multiplexer 134 via second locked output signal path 146 and to master control circuit 112 via second DLL control circuit paths 118. Master control circuit 112 is electrically coupled to first DLL circuit 126 and second DLL circuit 128 via control signal path 120 and to select input of output multiplexer 134 via output control path 124. The output of output multiplexer 134 is electrically coupled to forward path 102 via communications path 104.

Master control circuit 112 controls input circuit 132 to provide the recovered clock signal to first DLL circuit 126 via first clock signal path 140. First DLL circuit 126 receives the recovered clock signal and master control circuit 112 resets first DLL circuit 126 via control signal path 120 to lock first DLL circuit 126 onto the recovered clock signal. First DLL circuit 126 locks onto the recovered clock signal and provides a first DLL lock signal LCK1 at 148 to master control circuit 112 via first lock signal path 148. Also, first DLL circuit 126 provides a first locked clock signal LCLK1 at 144 to output multiplexer 134 via first locked output signal path 144. Master control circuit 112 controls output multiplexer 134 via output control path 124 to provide the first locked clock signal LCLK1 at 144 as locked output clock signal LCLK at 104. Forward path 102 receives locked output clock signal LCLK at 104 and provides output signals OUT at 110 that are locked to the recovered clock signal, i.e., differential clock signals CLK at 106 and bCLK at 108.

First DLL circuit 126 tracks the frequency changes of the recovered clock signal over a first frequency range of the recovered clock signal and provides corresponding frequency changes in first locked clock signal LCLK1 at 144 and in locked output clock signal LCLK at 104. As the frequency of differential clock signals CLK at 106 and bCLK at 108 approaches a boundary of the first frequency range, first DLL circuit 126 provides a warning signal to master control circuit 112. If the frequency of differential clock signals CLK at 106 and bCLK at 108 approaches a lower boundary of the first frequency range, first DLL circuit 126 provides a first overflow signal OF1 at 150 to master control circuit 112 via first overflow signal path 150. If the frequency of differential clock signals CLK at 106 and bCLK at 108 approaches an upper boundary of the first frequency range, first DLL circuit 126 provides a first underflow signal UF1 at 152 to master control circuit 112 via first underflow signal path 152.

Master control circuit 112 receives first overflow signal OF1 at 150 or first underflow signal UF1 at 152 and controls input circuit 132 to provide the recovered clock signal to first DLL circuit 126 via first clock signal path 140 and to second DLL circuit 128 via second clock signal path 142. Also, master control circuit 112 resets second DLL circuit 128 via control signal path 120 to lock second DLL circuit 128 onto the recovered clock signal. Second DLL circuit 128 locks onto the recovered clock signal and provides a second DLL lock signal LCK2 at 154 to master control circuit 112 via second lock signal path 154. In addition, second DLL circuit 128 provides a second locked clock signal LCLK2 at 146 to output multiplexer 134 via second locked output signal path 146. Master control circuit 112 controls output multiplexer 134 via output control path 124 to provide the second locked clock signal LCLK2 at 146 as locked output clock signal LCLK at 104. Forward path 102 receives locked output clock signal LCLK at 104 and provides output signals OUT at 110 that are locked to the recovered clock signal, i.e., differential clock signals CLK at 106 and bCLK at 108. Master control circuit 112 controls input circuit 132 to discontinue providing the recovered clock signal to first DLL circuit 126 and to continue providing the recovered clock signal to second DLL circuit 128.

Second DLL circuit 128 tracks the frequency changes of the recovered clock signal over a second frequency range of the recovered clock signal and provides corresponding frequency changes in second locked clock signal LCLK2 at 146 and in locked output clock signal LCLK at 104. The first and second frequency ranges are part of the system frequency range, such as the frequency range of a dynamic frequency change environment. As the frequency of differential clock signals CLK at 106 and bCLK at 108 approaches a boundary of the second frequency range, second DLL circuit 126 provides a warning signal to master control circuit 112. If the frequency of differential clock signals CLK at 106 and bCLK at 108 approaches a lower boundary of the second frequency range, second DLL circuit 126 provides a second overflow signal OF2 at 156 to master control circuit 112 via second overflow signal path 156. If the frequency of differential clock signals CLK at 106 and bCLK at 108 approaches an upper boundary of the second frequency range, second DLL circuit 126 provides a second underflow signal UF2 at 158 to master control circuit 112 via second underflow signal path 158.

Master control circuit 112 receives second overflow signal OF2 at 156 or second underflow signal UF2 at 158 and controls input circuit 132 to provide the recovered clock signal to first DLL circuit 126 via first clock signal path 140 and to second DLL circuit 128 via second clock signal path 142. Also, master control circuit 112 resets first DLL circuit 126 via control signal path 120 to lock first DLL circuit 126 onto the recovered clock signal in a third frequency range that is part of the system frequency range. DLL structure 100 continues by providing first locked clock signal LCLK1 at 144 in locked output clock signal LCLK at 104 over the third frequency range. Subsequent frequency ranges of the recovered clock signal are locked in and tracked via alternating between first DLL circuit 126 and second DLL circuit 128 to provide a continuously locked clock signal in locked output clock signal LCLK at 104 over the entire system frequency range.

Optionally, output phase detector 136 is electrically coupled to first DLL circuit 126 via first locked output signal path 144 and to second DLL circuit 128 via second locked output signal path 146. Also, master control circuit 112 is electrically coupled to the output of output phase detector 136 via detector output path 160. At transitions between frequency ranges, both first DLL circuit 126 and second DLL circuit 128 are locked onto the recovered clock signal and output phase detector 136 receives first locked clock signal LCLK1 at 144 and second locked clock signal LCLK2 at 146. Output phase detector 136 detects the difference between the phase of first locked clock signal LCLK1 at 144 and the phase of second locked clock signal LCLK2 at 146 and provides the detected difference to master control circuit 112. Master control circuit 112 provides control signals to first DLL circuit 126 and second DLL circuit 128 via control signal path 120 to align the phases of first locked clock signal LCLK1 at 144 and second locked clock signal LCLK2 at 146. After the phases are further aligned, master control circuit 112 controls output multiplexer 134 to provide the other one of first locked clock signal LCLK1 at 144 and second locked clock signal LCLK2 at 146 in locked output clock signal LCLK at 104.

First DLL circuit 126 includes a first DLL variable delay (VD1) 162, a first DLL phase detector (PD1) 164, a first DLL control circuit (CTRL1) 166, a first DLL feedback delay circuit (FB1) 168, and non-inverting buffers 170 and 172. The output of buffer 170 is electrically coupled to a signal input of first DLL variable delay 162 and one of the inputs of first DLL phase detector 164 via buffer output path 174. The output of first DLL variable delay 162 is electrically coupled to the input of buffer 172 via variable delay output path 176 and the output of buffer 172 is electrically coupled to the input of first DLL feedback delay circuit 168 and one input of output multiplexer 134 via first locked output signal path 144. The other input of first DLL phase detector 164 is electrically coupled to the output of first DLL feedback delay circuit 168 via feedback delay path 178.

First DLL control circuit 166 is electrically coupled to the output of first DLL phase detector 164 via detector output path 180. Also, first DLL control circuit 166 is electrically coupled to a control input of first DLL variable delay 162 via variable delay control path 182. In addition, first DLL control circuit 166 is electrically coupled to master control circuit 112 via control signal path 120, first lock signal path 148, first overflow signal path 150, and first underflow signal path 152.

The input of buffer 170 receives the recovered clock signal via first clock signal path 140 and provides the clock signal to first DLL variable delay 162 and first DLL phase detector 164 via buffer output path 174. First DLL variable delay 162 delays the clock signal and provides a delayed clock signal to buffer 172 via variable delay output path 176. Buffer 172 provides a delayed clock signal to first DLL feedback delay circuit 168 via first locked output signal path 144 and first DLL feedback delay circuit 168 provides a further delayed clock signal to first DLL phase detector 164 via feedback delay path 178.

First DLL phase detector 164 receives the recovered clock signal from buffer 170 and the further delayed clock signal from first DLL feedback delay circuit 168 and provides a detector output that indicates the phase difference between the phase of the recovered clock signal and the phase of the further delayed clock signal. First DLL control circuit 166 receives the detector output via detector output path 180 and provides a control signal to first DLL variable delay 162 via variable delay control path 182. First DLL control circuit 166 adjusts the delay through first DLL variable delay 162 to align the phase of the recovered clock signal and the phase of the further delayed clock signal.

Master control circuit 112 provides a reset signal to first DLL control circuit 166 via control signal path 120. First DLL control circuit 166 begins adjusting the delay through first DLL variable delay 162 to lock onto the recovered clock signal in response to the reset signal. After a suitable number of clock cycles of the recovered clock signal, the phase of the recovered clock signal and the phase of the further delayed clock signal are aligned. First DLL circuit 126 provides first locked clock signal LCLK1 at 144 and first DLL control circuit 166 provides first DLL lock signal LCK1 at 148 to master control circuit 112. In one embodiment, a suitable number of clock cycles for locking onto the recovered clock signal is less than 300 clock cycles. In one embodiment, a suitable number of clock cycles for locking onto the recovered clock signal is less than 500 clock cycles.

First DLL circuit 126 tracks the frequency changes of the recovered clock signal over a first frequency range of the recovered clock signal and provides corresponding frequency changes in first locked clock signal LCLK1 at 144. First DLL circuit 126 tracks the frequency changes of the recovered clock signal via first DLL control circuit 166 adjusting the delay through first DLL variable delay 162. The frequency bandwidth of the first frequency range is based on the delay range of the first DLL variable delay 162.

As the delay through first DLL variable delay 162 approaches an upper limit or a lower limit of first DLL variable delay 162, the frequency of differential clock signals CLK at 106 and bCLK at 108 approaches a boundary of the first frequency range and first DLL control circuit 166 provides a warning signal to master control circuit 112. If the frequency of differential clock signals CLK at 106 and bCLK at 108 approaches a lower boundary of the first frequency range, the delay through first DLL variable delay 162 approaches the upper limit and first DLL control circuit 166 provides the first overflow signal OF1 at 150 to master control circuit 112. If the frequency of differential clock signals CLK at 106 and bCLK at 108 approaches an upper boundary of the first frequency range, the delay through first DLL variable delay 162 approaches the lower limit and first DLL control circuit 166 provides the first underflow signal UF1 at 152 to master control circuit 112.

Master control circuit 112 receives first overflow signal OF1 at 150 or first underflow signal UF1 at 152 and controls input circuit 132 to provide the recovered clock signal to first DLL circuit 126 via first clock signal path 140 and to second DLL circuit 128 via second clock signal path 142. Also, master control circuit 112 resets second DLL circuit 128 via control signal path 120 to lock second DLL circuit 128 onto the recovered clock signal. Second DLL circuit 128 locks onto the recovered clock signal and provides a second DLL lock signal LCK2 at 154 to master control circuit 112 via second lock signal path 154. In addition, second DLL circuit 128 provides a second locked clock signal LCLK2 at 146 to output multiplexer 134 via second locked output signal path 146. Master control circuit 112 controls output multiplexer 134 via output control path 124 to provide the second locked clock signal LCLK2 at 146 as locked output clock signal LCLK at 104. Forward path 102 receives locked output clock signal LCLK at 104 and provides output signals OUT at 110 that are locked to the recovered clock signal, i.e., differential clock signals CLK at 106 and bCLK at 108. Master control circuit 112 controls input circuit 132 to discontinue providing the recovered clock signal to first DLL circuit 126 and to continue providing the recovered clock signal to second DLL circuit 128.

First DLL feedback delay circuit 168 provides a signal delay that mimics the delay from the output of buffer 172 and through forward path 102 to output signals OUT at 110 plus the delay from circuit inputs of differential clock signals CLK at 106 and bCLK at 108 to the output of buffer 170. This delay through first DLL feedback delay circuit 168 aligns the edges in output signals OUT at 110 to edges in differential clock signals CLK at 106 and bCLK at 108.

First DLL circuit 126 locks onto the recovered clock signal to provide edges in output signals OUT at 110 that are an integer number of clock cycles of the recovered clock signal delayed from the edges in the differential clock signals CLK at 106 and bCLK at 108. This integer number of clock cycles is the clock lock mode of first DLL circuit 126 when it is locked onto the recovered clock signal. First DLL circuit 126 locks onto the recovered clock signal in any suitable clock lock mode. If the period of the recovered clock signal is greater than the delay through first DLL feedback delay circuit 168, first DLL circuit 126 locks onto the recovered clock signal in one clock lock mode, which indicates that edges in output signals OUT at 110 are one clock cycle delayed from corresponding edges in differential clock signals CLK at 106 and bCLK at 108. If the period of the recovered clock signal is just less than the delay through first DLL feedback delay circuit 168, first DLL circuit 126 locks onto the recovered clock signal in two clock lock mode, which indicates that edges in output signals OUT at 110 are two clock cycles delayed from corresponding edges in differential clock signals CLK at 106 and bCLK at 108. First DLL circuit 126 locks onto the recovered clock signal in any suitable clock lock mode, such as up to three clock lock mode, four clock lock mode, or five clock lock mode.

Second DLL circuit 128 is similar to first DLL circuit 126. Second DLL circuit 128 includes a second DLL variable delay (VD2) 184, a second DLL phase detector (PD2) 186, a second DLL control circuit (CTRL2) 188, a second DLL feedback delay circuit (FB2) 190, and non-inverting buffers 192 and 194. The output of buffer 192 is electrically coupled to a signal input of second DLL variable delay 184 and one of the inputs of second DLL phase detector 186 via buffer output path 196. The output of second DLL variable delay 184 is electrically coupled to the input of buffer 194 via variable delay output path 198 and the output of buffer 194 is electrically coupled to the input of second DLL feedback delay circuit 190 and the other input of output multiplexer 134 via second locked output signal path 146. The other input of second DLL phase detector 186 is electrically coupled to the output of second DLL feedback delay circuit 190 via feedback delay path 200.

Second DLL control circuit 188 is electrically coupled to the output of second DLL phase detector 186 via detector output path 202. Also, second DLL control circuit 188 is electrically coupled to a control input of second DLL variable delay 184 via variable delay control path 204. In addition, second DLL control circuit 188 is electrically coupled to master control circuit 112 via control signal path 120, second lock signal path 154, second overflow signal path 156, and second underflow signal path 158.

The input of buffer 192 receives the recovered clock signal via second clock signal path 142 and provides the clock signal to second DLL variable delay 184 and second DLL phase detector 186 via buffer output path 196. Second DLL variable delay 184 delays the clock signal and provides a delayed clock signal to buffer 194 via variable delay output path 198. Buffer 194 provides a delayed clock signal to second DLL feedback delay circuit 190 via second locked output signal path 146 and second DLL feedback delay circuit 190 provides a further delayed clock signal to second DLL phase detector 186 via feedback delay path 200.

Second DLL phase detector 186 receives the recovered clock signal from buffer 192 and the further delayed clock signal from second DLL feedback delay circuit 190 and provides a detector output that indicates the phase difference between the phase of the recovered clock signal and the phase of the further delayed clock signal. Second DLL control circuit 188 receives the detector output via detector output path 202 and provides a control signal to second DLL variable delay 184 via variable delay control path 204. Second DLL control circuit 188 adjusts the delay through second DLL variable delay 184 to align the phase of the recovered clock signal and the phase of the further delayed clock signal.

Master control circuit 112 provides a reset signal to second DLL control circuit 188 via control signal path 120. Second DLL control circuit 188 begins adjusting the delay through second DLL variable delay 184 to lock onto the recovered clock signal in response to the reset signal. After a suitable number of clock cycles of the recovered clock signal, the phase of the recovered clock signal and the phase of the further delayed clock signal are aligned. Second DLL circuit 128 provides second locked clock signal LCLK2 at 146 and second DLL control circuit 188 provides second DLL lock signal LCK2 at 154 to master control circuit 112. In one embodiment, a suitable number of clock cycles for locking onto the recovered clock signal is less than 300 clock cycles. In one embodiment, a suitable number of clock cycles for locking onto the recovered clock signal is less than 500 clock cycles.

Second DLL circuit 128 tracks the frequency changes of the recovered clock signal over a second frequency range of the recovered clock signal and provides corresponding frequency changes in second locked clock signal LCLK2 at 146. Second DLL circuit 128 tracks the frequency changes of the recovered clock signal via second DLL control circuit 188 adjusting the delay through second DLL variable delay 184. The frequency bandwidth of the second frequency range is based on the delay range of the second DLL variable delay 184.

As the delay through second DLL variable delay 184 approaches an upper limit or a lower limit of second DLL variable delay 184, the frequency of differential clock signals CLK at 106 and bCLK at 108 approaches a boundary of the second frequency range and second DLL control circuit 188 provides a warning signal to master control circuit 112. If the frequency of differential clock signals CLK at 106 and bCLK at 108 approaches a lower boundary of the second frequency range, the delay through second DLL variable delay 184 approaches the upper limit and second DLL control circuit 188 provides the second overflow signal OF2 at 156 to master control circuit 112. If the frequency of differential clock signals CLK at 106 and bCLK at 108 approaches an upper boundary of the second frequency range, the delay through second DLL variable delay 184 approaches the lower limit and second DLL control circuit 188 provides the second underflow signal UF2 at 158 to master control circuit 112.

Master control circuit 112 receives second overflow signal OF2 at 156 or second underflow signal UF2 at 158 and controls input circuit 132 to provide the recovered clock signal to first DLL circuit 126 via first clock signal path 140 and to second DLL circuit 128 via second clock signal path 142. Also, master control circuit 112 resets first DLL circuit 126 via control signal path 120 to lock first DLL circuit 126 onto the recovered clock signal. First DLL circuit 126 locks onto the recovered clock signal and provides a first DLL lock signal LCK1 at 148 to master control circuit 112 via first lock signal path 148. In addition, first DLL circuit 126 provides a first locked clock signal LCLK1 at 144 to output multiplexer 134 via first locked output signal path 144. Master control circuit 112 controls output multiplexer 134 via output control path 124 to provide the first locked clock signal LCLK1 at 144 as locked output clock signal LCLK at 104. Forward path 102 receives locked output clock signal LCLK at 104 and provides output signals OUT at 110 that are locked to the recovered clock signal, i.e., differential clock signals CLK at 106 and bCLK at 108. Master control circuit 112 controls input circuit 132 to discontinue providing the recovered clock signal to second DLL circuit 128 and to continue providing the recovered clock signal to first DLL circuit 126.

Second DLL feedback delay circuit 190 provides a signal delay that mimics the delay from the output of buffer 194 and through forward path 102 to output signals OUT at 110 plus the delay from circuit inputs of differential clock signals CLK at 106 and bCLK at 108 to the output of buffer 192. This delay through second DLL feedback delay circuit 190 aligns the edges in output signals OUT at 110 to edges in differential clock signals CLK at 106 and bCLK at 108.

Second DLL circuit 128 locks onto the recovered clock signal to provide edges in output signals OUT at 110 that are an integer number of clock cycles of the recovered clock signal delayed from the edges in the differential clock signals CLK at 106 and bCLK at 108. This integer number of clock cycles is the clock lock mode of second DLL circuit 128 when it is locked onto the recovered clock signal. Second DLL circuit 128 locks onto the recovered clock signal in any suitable clock lock mode. If the period of the recovered clock signal is greater than the delay through second DLL feedback delay circuit 190, second DLL circuit 128 locks onto the recovered clock signal in one clock lock mode, which indicates that edges in output signals OUT at 110 are one clock cycle delayed from corresponding edges in differential clock signals CLK at 106 and bCLK at 108. If the period of the recovered clock signal is just less than the delay through second DLL feedback delay circuit 190, second DLL circuit 128 locks onto the recovered clock signal in two clock lock mode, which indicates that edges in output signals OUT at 110 are two clock cycles delayed from corresponding edges in differential clock signals CLK at 106 and bCLK at 108. Second DLL circuit 128 locks onto the recovered clock signal in any suitable clock lock mode, such as up to three clock lock mode, four clock lock mode, or five clock lock mode.

In operation, master control circuit 112 controls input circuit 132 to provide the recovered clock signal to first DLL circuit 126. Master control circuit 112 resets first DLL circuit 126 to lock first DLL circuit 126 onto the recovered clock signal. Buffer 170 receives the recovered clock signal and provides the clock signal to first DLL variable delay 162 and first DLL phase detector 164. First DLL variable delay 162 delays the clock signal and provides a delayed clock signal to buffer 172 that provides a delayed clock signal to first DLL feedback delay circuit 168. The first DLL feedback delay circuit 168 provides a further delayed clock signal to first DLL phase detector 164.

First DLL phase detector 164 receives the recovered clock signal from buffer 170 and the further delayed clock signal from first DLL feedback delay circuit 168 and provides a detector output that indicates the phase difference between the phase of the recovered clock signal and the phase of the further delayed clock signal. First DLL control circuit 166 receives the detector output and provides a control signal to first DLL variable delay 162 to adjust the delay through first DLL variable delay 162 and align the phase of the recovered clock signal and the phase of the further delayed clock signal.

First DLL circuit 126 locks onto the recovered clock signal in a first clock lock mode, such as one or two clock lock mode, and provides a first DLL lock signal LCK1 at 148 to master control circuit 112. Also, first DLL circuit 126 provides a first locked clock signal LCLK1 at 144 to output multiplexer 134. Master control circuit 112 controls output multiplexer 134 via output control path 124 to provide the first locked clock signal LCLK1 at 144 as locked output clock signal LCLK at 104. Forward path 102 receives locked output clock signal LCLK at 104 and provides output signals OUT at 110 that are locked to the recovered clock signal, i.e., differential clock signals CLK at 106 and bCLK at 108.

First DLL circuit 126 tracks the frequency changes of the recovered clock signal over a first frequency range of the recovered clock signal and provides corresponding frequency changes in first locked clock signal LCLK1 at 144 and in locked output clock signal LCLK at 104. As the delay through first DLL variable delay 162 approaches an upper limit or a lower limit of first DLL variable delay 162, first DLL control circuit 166 provides a warning signal to master control circuit 112.

Master control circuit 112 receives first overflow signal OF1 at 150 or first underflow signal UF1 at 152 and controls input circuit 132 to provide the recovered clock signal to first DLL circuit 126 and to second DLL circuit 128. Also, master control circuit 112 resets second DLL circuit 128 to lock second DLL circuit 128 onto the recovered clock signal. Buffer 192 receives the recovered clock signal and provides the clock signal to second DLL variable delay 184 and second DLL phase detector 186. Second DLL variable delay 184 delays the clock signal and provides a delayed clock signal to buffer 194 that provides a delayed clock signal to second DLL feedback delay circuit 190. Second DLL feedback delay circuit 190 provides a further delayed clock signal to second DLL phase detector 186.

Second DLL phase detector 186 receives the recovered clock signal from buffer 192 and the further delayed clock signal from second DLL feedback delay circuit 190 and provides a detector output that indicates the phase difference between the phase of the recovered clock signal and the phase of the further delayed clock signal. First DLL control circuit 188 receives the detector output and provides a control signal to second DLL variable delay 184 to adjust the delay through second DLL variable delay 184 and align the phase of the recovered clock signal and the phase of the further delayed clock signal.

Second DLL circuit 128 locks onto the recovered clock signal in a second clock lock mode, such as one or two clock lock mode, and provides a second DLL lock signal LCK2 at 154 to master control circuit 112. Also, second DLL circuit 128 provides a second locked clock signal LCLK2 at 146 to output multiplexer 134 via second locked output signal path 146. Master control circuit 112 controls output multiplexer 134 via output control path 124 to provide the second locked clock signal LCLK2 at 146 as locked output clock signal LCLK at 104. Forward path 102 receives locked output clock signal LCLK at 104 and provides output signals OUT at 110 that are locked to the recovered clock signal, i.e., differential clock signals CLK at 106 and bCLK at 108. Master control circuit 112 controls input circuit 132 to discontinue providing the recovered clock signal to first DLL circuit 126 and to continue providing the recovered clock signal to second DLL circuit 128.

Second DLL circuit 128 tracks the frequency changes of the recovered clock signal over a second frequency range of the recovered clock signal and provides corresponding frequency changes in second locked clock signal LCLK2 at 146 and in locked output clock signal LCLK at 104. As the delay through second DLL variable delay 184 approaches an upper limit or a lower limit of second DLL variable delay 184, second DLL control circuit 188 provides a warning signal to master control circuit 112.

Master control circuit 112 receives second overflow signal OF2 at 156 or second underflow signal UF2 at 158 and controls input circuit 132 to provide the recovered clock signal to first DLL circuit 126 and to second DLL circuit 128. Also, master control circuit 112 resets first DLL circuit 126 to lock first DLL circuit 126 onto the recovered clock signal in a third frequency range that is part of the system frequency range. DLL structure 100 continues by providing first locked clock signal LCLK1 at 144 in locked output clock signal LCLK at 104 over the third frequency range. Subsequent frequency ranges of the recovered clock signal are locked in and tracked via alternating between first DLL circuit 126 and second DLL circuit 128 to provide a continuously locked clock signal in locked output clock signal LCLK at 104 over the entire system frequency range.

Figure 4:
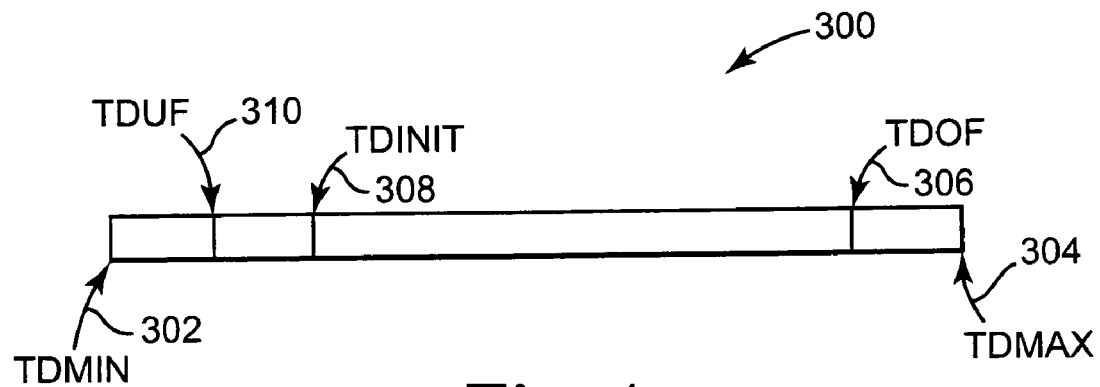
FIG. 4 is a diagram illustrating one embodiment of an overflow and underflow detection scheme in a DLL circuit.

FIG. 4 is a diagram illustrating one embodiment of an overflow and underflow detection scheme 300 in a DLL circuit, such as first DLL circuit 126 and second DLL circuit 128. A DLL control circuit, such as first DLL control circuit 166 and second DLL control circuit 188, adjusts the delay through a variable delay circuit, such as first DLL variable delay 162 and second DLL variable delay 184, between a time delay minimum TDMIN at 302 and a time delay maximum TDMAX at 304. The time delay minimum TDMIN at 302 is the shortest delay through the variable delay circuit and the time delay maximum TDMAX at 304 is the longest delay through the variable delay circuit.

If the currently locked DLL control circuit adjusts the delay through the variable delay circuit to the time delay overflow value TDOF at 306, the currently locked DLL control circuit provides an overflow signal, such as first overflow signal OF1 at 150 or second overflow signal OF2 at 156, to the master control circuit 112. The other DLL circuit is reset to lock onto the recovered clock signal. The difference between the time delay overflow value TDOF at 306 and the time delay maximum TDMAX at 304 is sufficient to tolerate the increase in the recovered clock signal period during the time it takes for the other DLL circuit to lock onto the recovered clock signal.

To lock onto the recovered clock signal, the other DLL circuit begins adjusting the delay in the corresponding variable delay circuit from an initial time delay TDINIT at 308. The other DLL circuit adjusts the delay through the variable delay circuit toward the time delay maximum TDMAX at 304 and locks onto the recovered clock signal in a different clock lock mode than the currently locked DLL circuit.

If the currently locked DLL control circuit adjusts the delay through the variable delay circuit to the time delay underflow value TDUF at 310, the currently locked DLL control circuit provides an underflow signal, such as first underflow signal UF1 at 152 or second underflow signal UF2 at 158, to the master control circuit 112. The other DLL circuit, which is not currently locked onto the recovered clock signal, is reset to lock onto the recovered clock signal. The difference between the time delay underflow value TDUF at 310 and the time delay minimum TDMIN at 302 is sufficient to tolerate the decrease in the recovered clock signal period during the time it takes for the other DLL circuit to lock onto the recovered clock signal.

To lock onto the recovered clock signal, the other DLL circuit begins adjusting the delay in the corresponding variable delay circuit from initial time delay TDINIT at 308. The other DLL circuit adjusts the delay through the variable delay circuit toward the time delay maximum TDMAX at 304 and locks onto the recovered clock signal in a different clock lock mode than the currently locked DLL circuit. In one embodiment, the difference between the time delay underflow value TDUF at 310 and the initial time delay TDINIT at 308 is sufficient to tolerate voltage and temperature variations in the variable delay circuits. In one embodiment, the time delay underflow value TDUF at 310 and the initial time delay TDINIT at 308 are substantially the same value.

Figure 5:
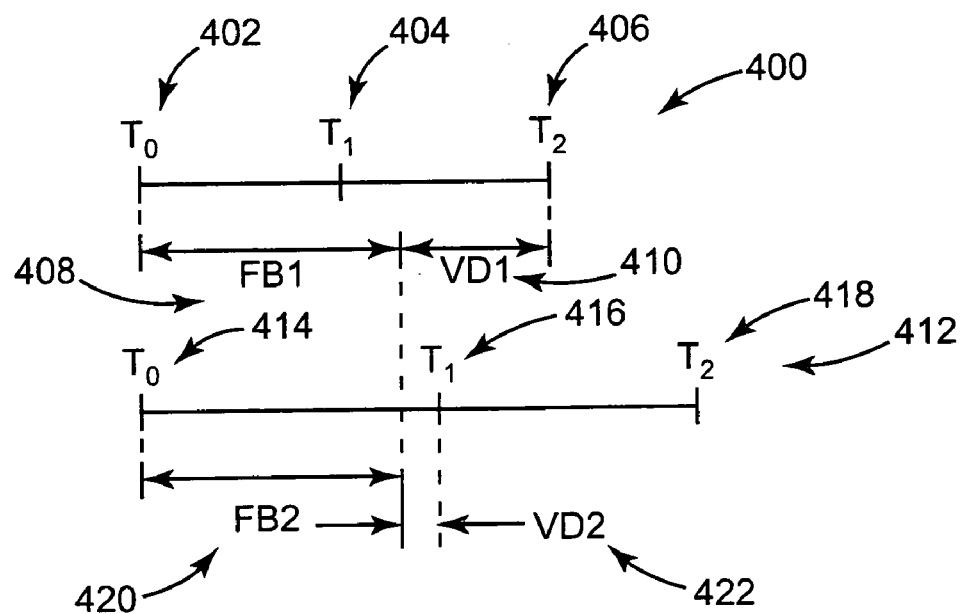
FIG. 5 is a timing diagram illustrating the operation of one embodiment of a DLL structure.

FIG. 5 is a timing diagram illustrating the operation of one embodiment of DLL structure 100. The clock signal provided via differential clock signals CLK at 106 and bCLK at 108 has a first frequency at 400. The period of the first frequency is the difference between time T0 at 402 and time T1 at 404, and the difference between time T1 at 404 and time T2 at 406. First DLL circuit 126 locks onto the first frequency of the clock signal at 400. First DLL feedback delay circuit 168 represents the input path delay plus the output path delay of the integrated circuit that includes DLL structure 100 and provides a first feedback delay FB1 at 408 that is longer than the period of the first frequency, which is the difference between time T0 at 402 and time T1 at 404. First DLL variable delay 162 provides the first variable delay VD1 at 410 to lock first DLL circuit 126 onto the clock signal. First DLL circuit 126 locks onto the clock signal in two clock lock mode and provides a two clock cycle delay through the integrated circuit, such as RAM 34.

The clock signal frequency gradually changes from the first frequency at 400 to the second frequency at 412. The period of the second frequency is the difference between time T0 at 414 and time T1 at 416, and the difference between time T1 at 416 and time T2 at 418. As the clock signal frequency changes from the first frequency at 400 to the second frequency at 412, the first variable delay VD1 at 410 is increased to extend up to time T2 at 418. When first variable delay VD1 at 410 reaches the time delay overflow value TDOF of first DLL variable delay 162, the corresponding first DLL control circuit 166 provides a warning to master control circuit 112, which resets second DLL circuit 128 to lock onto the clock signal. Second DLL circuit 128 locks onto the second frequency of the clock signal at 412. Second DLL feedback delay circuit 190 provides second feedback delay FB2 at 420 that is substantially equal to the first feedback delay FB1 at 408 and shorter than the period of the second frequency, which is the difference between time T0 at 414 and time T1 at 416. Second DLL circuit 128 locks onto the second frequency of the clock signal at 412 via scanning second DLL variable delay 184 from the initial time delay value TDINIT toward a larger time delay value. Second DLL variable delay 184 provides a second variable delay VD2 at 422. Seocnd DLL circuit 128 locks onto the clock signal in one clock lock mode to provide a one cycle delay through the integrated circuit, such as RAM 34.

The clock signal frequency can also gradually change from the second frequency at 412 to the first frequency at 400. In this situation, second DLL circuit 128 locks onto the second frequency of the clock signal at 412. Second DLL feedback delay circuit 190 provides second feedback delay FB2 at 420 that is shorter than the period of the second frequency, which is the difference between time T0 at 414 and time T1 at 416. Second DLL variable delay 184 provides the second variable delay VD2 at 422 to lock second DLL circuit 128 onto the clock signal. Second DLL circuit 128 locks onto the clock signal in one clock lock mode and provides a one clock cycle delay through the integrated circuit, such as RAM 34.

The clock signal frequency gradually changes from the second frequency at 412 to the first frequency at 400. When second variable delay VD2 at 422 reaches the time delay underflow value TDUF of second DLL variable delay 184, second DLL control circuit 188 provides a warning to master control circuit 112, which resets first DLL circuit 126 to lock onto the clock signal. First DLL circuit 126 locks onto the first frequency of the clock signal at 400. First DLL feedback delay 168 provides first feedback delay FB1 at 408 that is substantially equal to the second feedback delay FB2 at 420. First DLL circuit 126 locks onto the first frequency of the clock signal at 400 via scanning first DLL variable delay 162 from the initial time delay value TDINIT toward a larger time delay value. First DLL variable delay 162 provides a first variable delay, such as first variable delay VD1, and first DLL circuit 126 locks onto the clock signal in two clock lock mode to provide a two clock cycle delay through the integrated circuit, such as RAM 34. In other example operations, first and second DLL circuits 126 and 128 can lock onto the clock signals in other clock lock modes, such as two and three clock lock modes or three and four clock lock modes.

In a dynamic frequency change environment, the clock signal frequency slowly changes from one frequency to any other frequency within the frequency range of the dynamic frequency change environment. The DLL structure receives clock signals and locks onto the recovered clock signal to provide a first locked clock signal over a first frequency range and a second locked clock signal over a second frequency range. The DLL structure provides a locked one of the first locked clock signal and the second locked clock signal in a locked output clock signal to continuously provide a locked clock signal in the locked output clock signal as the clock frequency traverses the system frequency range. The locked output clock signal is continuously locked to the frequency of the differential clock signals over the system frequency range.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A delay locked loop, comprising:
a first circuit configured to receive a clock signal having a frequency and to lock onto the clock signal and provide a first locked clock signal over a first frequency range and a second locked clock signal over a second frequency range; and
a second circuit configured to signal the first circuit to lock onto the clock signal to provide the second locked clock signal as the frequency changes from the first frequency range to the second frequency range and to signal the first circuit to provide a locked one of the first locked clock signal and the second locked clock signal in a locked output clock signal.

2. The delay locked loop of claim 1, wherein the second circuit is configured to signal the first circuit to lock onto the clock signal to provide the first locked clock signal as the frequency changes from the second frequency range to the first frequency range.

3. The delay locked loop of claim 1, wherein the first circuit is configured to provide a warning signal that indicates the first locked clock signal is approaching a locked clock signal limit and the second circuit is configured to signal the first circuit to lock onto the clock signal to provide the second locked clock signal in response to the warning signal.

4. The delay locked loop of claim 1, wherein the first circuit is configured to provide a lock signal that indicates at least one of:
the first circuit is locked onto the clock signal to provide the first locked clock signal; and
the first circuit is locked onto the clock signal to provide the second locked clock signal.

5. The delay locked loop of claim 1, wherein the first circuit comprises:
a first delay locked loop configured to lock onto the clock signal and track the clock signal over the first frequency range to provide the first locked clock signal; and
a second delay locked loop configured to lock onto the clock signal and track the clock signal over the second frequency range to provide the second locked clock signal.

6. The delay locked loop of claim 1, wherein the first circuit comprises:
a multiplexer configured to receive the first locked clock signal and the second locked clock signal and provide the locked output clock signal that is continuously locked as the clock frequency traverses the first frequency range and the second frequency range, wherein the second circuit is configured to signal the multiplexer to provide the locked one of the first locked clock signal and the second locked clock signal in the continuously locked output clock signal.

7. The delay locked loop of claim 1, wherein the first circuit comprises:
a phase detector configured to receive the first locked clock signal and the second locked clock signal and provide a phase detector output that indicates the difference between the phase of the first locked clock signal and the phase of the second locked clock signal and the second circuit is configured to receive the phase detector output and adjust the first circuit to align the phase of the first locked clock signal and the phase of the second locked clock signal.

8. A random access memory, comprising:
a first circuit configured to lock onto a clock signal having a clock frequency and track the clock signal as the clock frequency changes over a first range to provide a first locked clock signal;
a second circuit configured to lock onto the clock signal and track the clock signal as the clock frequency changes over a second range to provide a second locked clock signal; and
a third circuit configured to signal the first circuit to lock onto the clock signal over the first range and to signal the second circuit to lock onto the clock signal over the second range and to provide a locked one of the first locked clock signal and the second locked clock signal in a locked output clock signal.

9. The random access memory of claim 8, wherein the first circuit is configured to lock onto the clock signal in a first clock mode that delays the clock signal to provide an output signal a first integer number of cycles of the clock signal after the clock signal and the second circuit is configured to lock onto the clock signal in a second clock mode that delays the clock signal to provide the output signal a second integer number of cycles of the clock signal after the clock signal.

10. The random access memory of claim 8, wherein the first circuit is configured to provide an overflow signal that indicates the first circuit is approaching a locked signal limit as the first circuit tracks the clock signal and the third circuit is configured to receive the overflow signal and signal the second circuit to lock onto the clock signal.

11. The random access memory of claim 8, wherein the first circuit is configured to provide an underflow signal that indicates the first circuit is approaching a locked signal limit as the first circuit tracks the clock signal and the third circuit is configured to receive the underflow signal and signal the second circuit to lock onto the clock signal.

12. The random access memory of claim 8, wherein the first circuit is configured to provide a locked signal that indicates the first circuit is locked onto the clock signal and the third circuit is configured to receive the locked signal and provide the first locked clock signal as the locked output clock signal.

13. The random access memory of claim 8, comprising a phase detector configured to receive the first locked clock signal and the second locked clock signal and provide a phase detector output that indicates the difference between the phase of the first locked clock signal and the phase of the second locked clock signal and the third circuit is configured to receive the phase detector output and adjust the first circuit and the second circuit to further align the phase of the first locked clock signal and the phase of the second locked clock signal.

14. A random access memory, comprising:
a first delay locked loop configured to lock onto a clock signal in a first clock mode to provide a first locked clock signal over a first clock frequency range, wherein the first delay locked loop comprises:
a first delay circuit configured to provide a first delay in a delay range having an upper limit and a lower limit to track the clock signal over the first clock frequency range; and
a first delay locked loop control circuit configured to provide a first overflow signal to indicate that the first delay provided by the first delay circuit is approaching the upper limit and a first underflow signal to indicate that the first delay provided by the first delay circuit is approaching the lower limit;

a second delay locked loop configured to lock onto the clock signal in a second clock mode to provide a second locked clock signal over a second clock frequency range, wherein the second delay locked loop comprises:
  a second delay circuit configured to provide a second delay in the delay range having the upper limit and the lower limit to track the clock signal over the second clock frequency range; and
  a second delay locked loop control circuit configured to provide a second overflow signal to indicate that the second delay provided by the second delay circuit is approaching the upper limit and a second underflow signal to indicate that the second delay provided by the second delay circuit is approaching the lower limit; and
a master control circuit configured to select one of the first locked clock signal and the second locked clock signal to provide a locked output clock signal that is locked to the clock signal as the clock signal frequency traverses the first clock frequency range and the second clock frequency range.

15. The random access memory of claim 14, wherein the master control circuit is configured to signal the second delay locked loop to lock onto the clock signal in response to the first overflow signal and to signal the second delay locked loop to lock onto the clock signal in response to the first underflow signal.

16. The random access memory of claim 15, wherein the second delay locked loop control circuit is configured to provide a lock signal that indicates the second delay locked loop is locked onto the clock signal and the master control circuit is configured to receive the lock signal and provide the second locked clock signal in the locked output clock signal.

17. The random access memory of claim 15, wherein the master control circuit is configured to signal the first delay locked loop to lock onto the clock signal in response to the second overflow signal and to signal the first delay locked loop to lock onto the clock signal in response to the second underflow signal.

18. The random access memory of claim 17, wherein the first delay locked loop control circuit is configured to provide a lock signal that indicates the first delay locked loop is locked onto the clock signal and the master control circuit is configured to receive the lock signal and provide the first locked clock signal as the locked output signal.

19. A random access memory, comprising:
  means for receiving a clock signal having a clock frequency;
  means for locking onto the clock signal to provide a first locked clock signal over a first frequency range at a first circuit;
  means for locking onto the clock signal to provide a second locked clock signal over a second frequency range at the first circuit;
  means for controlling the first circuit to lock onto the clock signal and provide the second locked clock signal as the clock frequency changes from the first frequency range to the second frequency range;
  means for controlling the first circuit to lock onto the clock signal and provide the first locked clock signal as the clock frequency changes from the second frequency range to the first frequency range; and
  means for providing the locked one of the first locked clock signal and the second locked clock signal in a locked output clock signal.

20. The random access memory of claim 19, wherein the means for controlling the first circuit to lock onto the clock signal and provide the second locked clock signal comprises:
  means for providing a warning signal that indicates the first locked clock signal is approaching a locked clock signal limit; and
  means for controlling the first circuit to lock onto the clock signal and provide the second locked clock signal in response to the warning signal.

21. The random access memory of claim 19, wherein the means for providing the locked one of the first locked clock signal and the second locked clock signal comprises:
  means for providing a first lock signal that indicates the first circuit is locked onto the clock signal to provide the first locked clock signal; and
  means for providing a second lock signal that indicates the first circuit is locked onto the clock signal to provide the second locked clock signal.

22. The random access memory of claim 19, comprising:
  means for detecting a phase difference between the phase of the first locked clock signal and the phase of the second locked clock signal; and
  means for aligning the phase of the first locked clock signal and the phase of the second locked clock signal.

23. A method for providing a locked clock signal from a delay locked loop structure, comprising:
  receiving a clock signal having a clock frequency;
  locking onto the clock signal to provide a first locked clock signal over a first frequency range at a first circuit;
  locking onto the clock signal to provide a second locked clock signal over a second frequency range at the first circuit;
  controlling the first circuit to lock onto the clock signal and provide the second locked clock signal as the clock frequency changes from the first frequency range to the second frequency range;
  controlling the first circuit to lock onto the clock signal and provide the first locked clock signal as the clock frequency changes from the second frequency range to the first frequency range; and
  providing a locked one of the first locked clock signal and the second locked clock signal in a continuously locked output clock signal.

24. The method of claim 23, wherein controlling the first circuit to lock onto the clock signal and provide the second locked clock signal comprises:
  providing a warning signal that indicates the first locked clock signal is approaching a locked clock signal limit; and
  signaling the first circuit to lock onto the clock signal and provide the second locked clock signal in response to the warning signal.

25. The method of claim 23, wherein providing a locked one of the first locked clock signal and the second locked clock signal comprises:
  providing a first lock signal that indicates the first circuit is locked onto the clock signal to provide the first locked clock signal; and
  providing a second lock signal that indicates the first circuit is locked onto the clock signal to provide the second locked clock signal.

26. The method of claim 25, wherein providing a locked one of the first locked clock signal and the second locked clock signal comprises:

receiving the first locked clock signal and the second locked clock signal at a multiplexer; and
signaling the multiplexer to provide one of the first locked clock signal and the second locked clock signal in the continuously locked output clock signal.

27. The method of claim 23, comprising:
detecting a phase difference between the phase of the first locked clock signal and the phase of the second locked clock signal; and
aligning the phase of the first locked clock signal and the phase of the second locked clock signal.

28. A method for providing a locked clock signal, comprising:
controlling a first delay locked loop to lock onto a clock signal having a clock frequency;
locking onto the clock signal via the first delay locked loop;
tracking the clock signal as the clock frequency changes over a first range to provide a first locked clock signal via the first delay locked loop;
controlling a second delay locked loop to lock onto the clock signal;
locking onto the clock signal via the second delay locked loop;
tracking the clock signal as the clock frequency changes over a second range to provide a second locked clock signal via the second delay locked loop; and
providing a locked one of the first locked clock signal and the second locked clock signal in a locked output clock signal.

29. The method of claim 28, wherein:
locking onto the clock signal via the first delay locked loop comprises locking onto the clock signal in a first clock mode that delays the clock signal to provide an output signal a first integer number of cycles of the clock signal after the clock signal; and
locking onto the clock signal via the second delay locked loop comprises locking onto the clock signal in a second clock mode that delays the clock signal to provide the output signal a second integer number of cycles of the clock signal after the clock signal.

30. The method of claim 28, comprising:
providing an overflow signal that indicates the first delay locked loop is approaching a locked signal limit;
receiving the overflow signal at a control circuit; and
signaling the second delay locked loop to lock onto the clock signal via the control circuit.

31. The method of claim 28, comprising:
providing an underflow signal that indicates the first delay locked loop is approaching a locked signal limit;
receiving the underflow signal at a control circuit; and
signaling the second delay locked loop to lock onto the clock signal via the control circuit.

32. The method of claim 28, wherein:
providing a locked signal that indicates the first delay locked loop is locked onto the clock signal;
receiving the locked signal at a control circuit; and
providing the first locked clock signal in the locked output clock signal.

33. The method of claim 28, wherein:
receiving the first locked clock signal and the second locked clock signal at a phase detector;
providing a phase difference between the phase of the first locked clock signal and the phase of the second locked clock signal via the phase detector;
receiving the phase difference at a control circuit; and
adjusting the first delay locked loop and the second delay locked loop to align the phase of the first locked clock signal and the phase of the second locked clock signal.

34. A method for providing a locked clock signal, comprising:
locking onto a clock signal in a first clock mode to provide a first locked clock signal over a first clock frequency range via a first delay locked loop;
delaying the clock signal a first delay in a delay range having an upper limit and a lower limit to track the clock signal over the first clock frequency range via a first delay circuit;
providing a first overflow signal via a first delay locked loop control circuit to indicate that the first delay is approaching the upper limit;
providing a first underflow signal via the first delay locked loop control circuit to indicate that the first delay is approaching the lower limit;
locking onto the clock signal in a second clock mode to provide a second locked clock signal over a second clock frequency range via a second delay locked loop;
delaying the clock signal a second delay in the delay range having the upper limit and the lower limit to track the clock signal over the second clock frequency range via a second delay circuit;
providing a second overflow signal via a second delay locked loop control circuit to indicate that the second delay is approaching the upper limit;
providing a second underflow signal via the second delay locked loop control circuit to indicate that the second delay is approaching the lower limit; and
selecting one of the first locked clock signal and the second locked clock signal to provide a locked output clock signal that is locked to the clock signal as the clock signal frequency traverses the first clock frequency range and the second clock frequency range.

35. The method of claim 34, comprising:
signaling the second delay locked loop to lock onto the clock signal in response to the first overflow signal; and
signaling the second delay locked loop to lock onto the clock signal in response to the first underflow signal.

36. The method of claim 35, comprising:
providing a lock signal that indicates the second delay locked loop is locked onto the clock signal; and
providing the second locked clock signal in the locked output clock signal in response to the lock signal.

37. The method of claim 35, comprising:
signaling the first delay locked loop to lock onto the clock signal in response to the second overflow signal; and
signaling the first delay locked loop to lock onto the clock signal in response to the second underflow signal.

38. The method of claim 37, comprising:
providing a lock signal that indicates the first delay locked loop is locked onto the clock signal; and
providing the first locked clock signal in the locked output signal in response to the lock signal.

* * * * *